United States Patent
Fan et al.

(10) Patent No.: US 7,301,777 B2
(45) Date of Patent: Nov. 27, 2007

(54) RETAINING DEVICE FOR EXPANSION CARDS

(75) Inventors: Chen-Lu Fan, Tu-Cheng (TW); Li-Ping Chen, Tu-Cheng (TW)

(73) Assignee: Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 380 days.

(21) Appl. No.: 11/018,288

(22) Filed: Dec. 20, 2004

(65) Prior Publication Data
US 2005/0152122 A1 Jul. 14, 2005

(30) Foreign Application Priority Data
Jan. 9, 2004 (TW) .............................. 93200363 U

(51) Int. Cl.
*H05K 5/00* (2006.01)
(52) U.S. Cl. ...................... 361/754; 361/796; 361/801; 361/683
(58) Field of Classification Search ................. 361/740, 361/747, 754, 756, 798, 801, 759; 439/157, 439/159–160
See application file for complete search history.

(56) References Cited
U.S. PATENT DOCUMENTS

| | | | |
|---|---|---|---|
| 5,542,854 A * | 8/1996 | Bowen | 439/157 |
| 5,943,215 A | 8/1999 | Carney et al. | 361/756 |
| 6,396,703 B1 * | 5/2002 | White | 361/754 |
| 6,749,439 B1 * | 6/2004 | Potter et al. | 439/65 |
| 2003/0016496 A1 | 1/2003 | Kim et al. | 361/695 |

\* cited by examiner

*Primary Examiner*—Dean A. Reichard
*Assistant Examiner*—Hung S Bui
(74) *Attorney, Agent, or Firm*—Morris Manning Martin LLP; Tim Tingkang Xia, Esq.

(57) ABSTRACT

A retaining device (10) for retaining expansion cards (20) in a chassis (300) includes a riser card (40), a pair of ejectors (50) and a bracket (100). A motherboard (200) including a connector (210) is attached in the chassis, the connector includes a top wall (211). The ejectors are pivotally attached to the riser card. A pressing portion (55) and a locking portion (57) are formed on two ends of the ejectors respectively. A pair of restraining holes (122) is defined in the bracket. A locking hole (124) is defined beside the restraining hole. The ejectors extend through the restraining holes. The riser card is attached to the bracket and the expansion card is attached to the riser card. When assembly, the riser card is inserted into the connector, the locking portions engage with the locking holes. When the ejectors are rotated inwardly, the pressing portions press against the top wall of the connector and the riser card is lifted.

19 Claims, 6 Drawing Sheets

RETAINING DEVICE FOR EXPANSION CARDS

CROSS-REFERENCE TO RELATED APPLICATIONS

This application is related to U.S. patent application Ser. No. 10/982,280, entitled "RETAINING DEVICE FOR EXPANSION CARDS", filed on Nov. 5, 2004 with the same assignee as the instant application. The disclosure of the above identified application is incorporated herein by reference.

BACKGROUND OF THE INVENTION

1. Field of the Invention

The present invention relates to retaining devices, and particularly to a retaining device which securely retains expansion cards in a computer chassis.

2. Description of the Prior Art

A computer typically includes a chassis that encloses circuit components, such as processors, memory chips, peripheral interface devices and other circuit elements. The core circuit components, such as the processors and the memory chips, are often mounted on a single printed circuit board, such as a motherboard. It is often desirable to provide the computer with expansion ports or slots for attaching additional printed circuit cards ("expansion cards") having additional capabilities.

In one conventional arrangement, the expansion slots are provided on the motherboard. One drawback with this approach is that the expansion slots occupy valuable space on the motherboard. And nowadays the trend of the computer enclosure is small and thin. So a new type of computer enclosure has a limited height that cannot accommodate an expansion card directly mounted on the motherboard. One approach to addressing this drawback is to attach an intermediate riser card to a single slot of the motherboard and attach a plurality of expansion cards to the riser card.

Generally, The expansion card is horizontally attached on top of the riser card. A support component is applied on a top portion of the riser card to retain the expansion card. Such an arrangement for expansion card is disclosed in U.S. Pat. No. 5,943,215. A support block is mounted on the top of the riser card. The support block is engaged with a clasp extending from one side wall of the classis so that the riser card and the expansion card are retained. Another means is shown in US Patent Application No. 20030016496. Retaining means thereof comprises a bracket mounted on the riser card, which is also locked on one side wall of the classis. A plurality of parallel expansion cards is horizontally attached on the bracket. In assembly, generally, the riser card is directly inserted in the slot of the motherboard, and in disassembly, the riser card is directly drawn out. During these processes, the riser card and the expansion cards are susceptible to be damaged. When the computer is moved to anther place or sustains external shocks, the riser cards and the option cards are prone to be loosed or detached from the motherboard and the riser cards, respectively.

BRIEF SUMMARY OF THE INVENTION

Accordingly, an object of the present invention is to provide a retaining device which securely attaches and readily detaches expansion cards in a computer chassis.

To achieve the above-mentioned object, a retaining device in accordance with a preferred embodiment of the present invention comprises a chassis with a motherboard attached therein, a riser card, a pair of ejectors and a bracket. The chassis comprises a side wall with a plurality of slits therein, the motherboard comprises a connector, the connector comprises a top wall. The bracket comprises a top plate, a side plate and a rear plate. A pair of restraining holes is defined in the top plate, and a locking hole is defined beside each of the restraining hole. A plurality of clasps extends from the top plate. The ejectors are pivotally attached to two sides of the riser card, each of the ejectors comprises a pivot arm, a pressing portion and a stopping portion are formed on one end thereof, and a locking portion and a handle are formed on the other end thereof. The ejectors extend through the corresponding restraining holes of the top plate of the bracket. The riser card is secured to the side plate of the bracket. The expansion card is attached to the riser card.

When the riser card is inserted in the connector, the ejectors are rotated downwardly with the pressing portions pressing against the top wall of the connector, and the locking portions engage in the locking holes of the bracket. Thus the retaining device with the expansion card is secured in the chassis. When disassembly, the handles are rotated inwardly, and the pressing portions pressing against the top wall of the connector. Thus the riser card is lifted and disengages from the chassis.

Other objects, advantages and novel features of the present invention will be drawn from the following detailed description of preferred embodiments of the present invention with the attached drawings, in which:

DETAILED DESCRIPTION OF THE INVENTION

Figure 1:
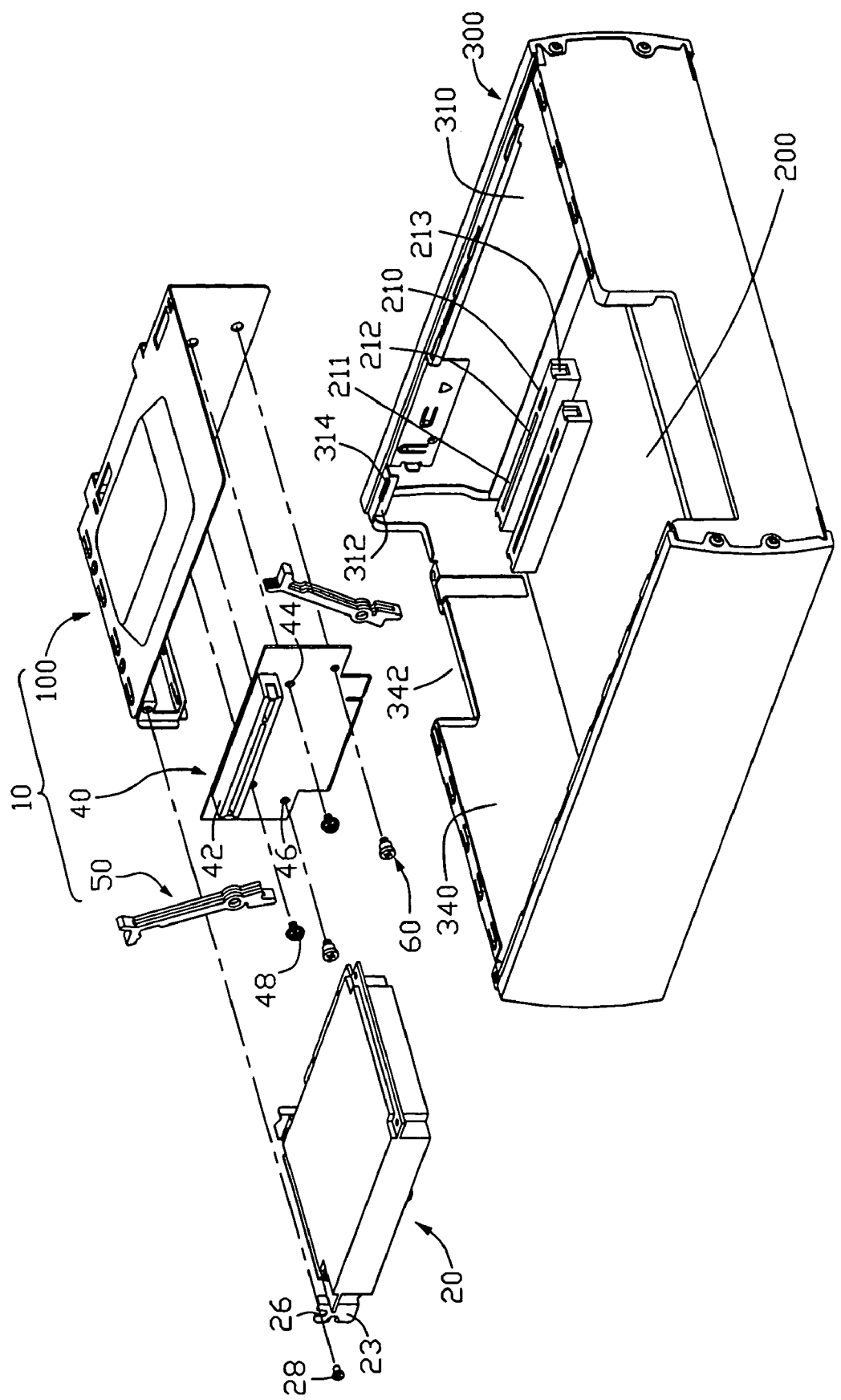
FIG. 1 is an exploded, isometric view of a retaining device in accordance with the preferred embodiment of the present invention, together with a computer chassis with a motherboard, the retaining device comprising a riser card, a pairs of ejectors and a bracket.

Referring to FIG. 1, a retaining device 10 in accordance with the preferred embodiment of the present invention for retaining an expansion card 20 in a chassis 300 of an electronic system like a computer includes a riser card 40, a pair of ejectors 50 and a bracket 100.

The computer chassis 300 comprises a side wall 310 and a rear wall 340. A flange 312 extends from a top edge of rear portion of the side wall 310. A plurality of slits 314 is defined in the flange 312. An opening 342 is defined in the top of the rear wall 340 near the side wall 310.

The computer chassis 300 has a motherboard 200 mounted therein. A connector 210 is a component of the motherboard 200. The riser card 40 can be both physically and electrically coupled to the connector 210. The connector 210 comprises a top wall 211. An expansion slot 212 for receiving the riser card 40 is defined in the top wall 211. A cutout 213 is defined in each end of the expansion slot 212.

The expansion card 20 comprises a fastening piece 23 on one side thereof. A fixing hole 26 is defined in one end of the fastening piece 23. The expansion card 20 is coupled to the motherboard 200 via the riser card 40.

The riser card 40 comprises an expansion connector 42 on one side on the top part thereof for extending the expansion card 20 horizontally over the motherboard 200. A pair of fixing holes 44 is defined under two ends of the expansion connector 42 respectively. Thereunder, a pair of through holes 46 is defined adjacent to the bottom of the riser card 40.

Figure 2:
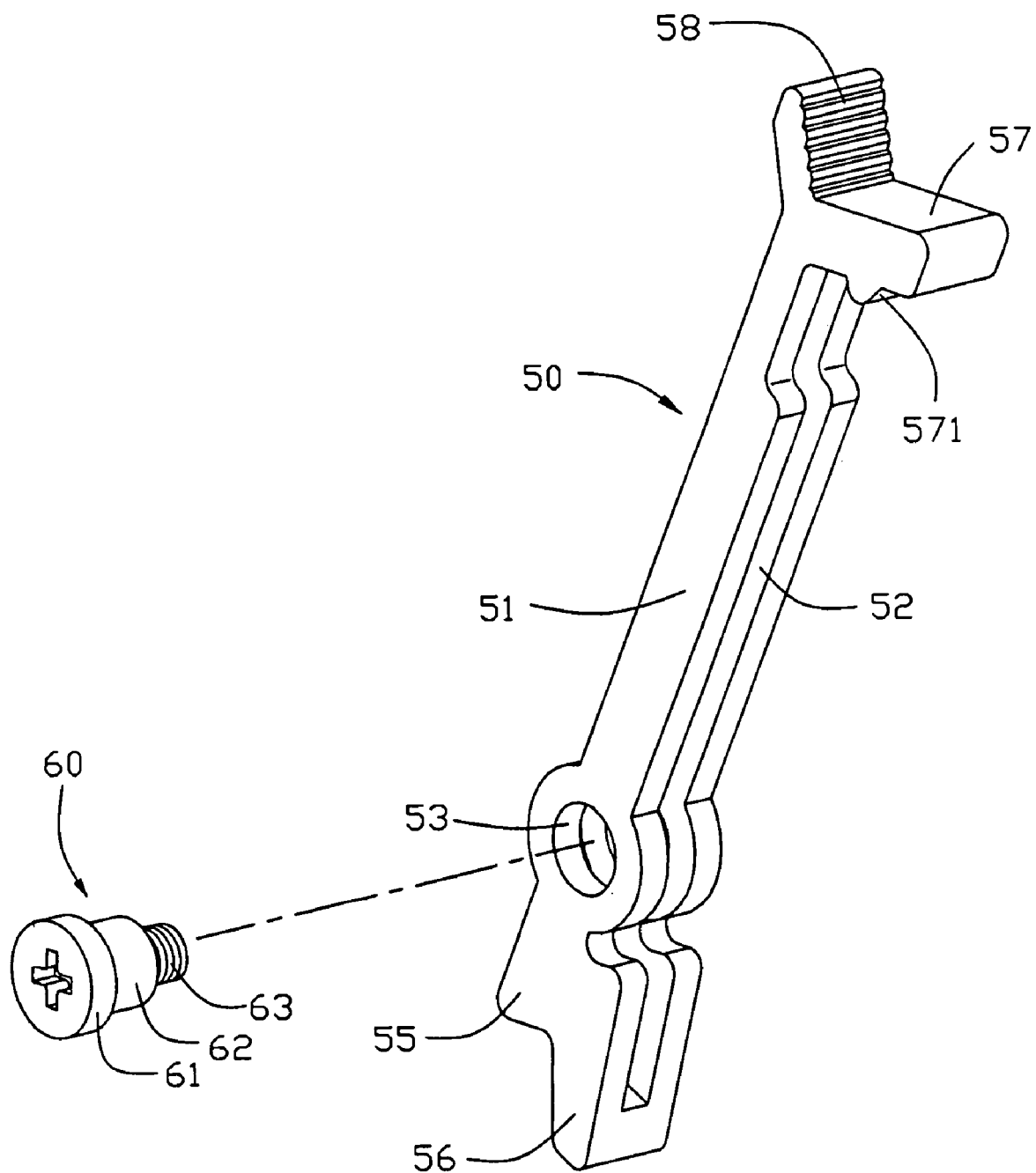
FIG. 2 is an isometric view of one of the ejectors of FIG. 1.

Referring also to FIG. 2, each of the ejectors 50 comprises a pivot arm 51. A through groove 52 is defined across the middle of the pivot arm 51 for being traversable to the riser card 40. A pivot hole 53 is defined adjacent to one end of the pivot arm 51. A pressing portion 55 is formed at the end, with a stopping portion 56 bent outwardly therefrom. A locking portion 57 is bent outwardly from the other end of the pivot arm 51. A protrusion 571 projects downwardly from the middle part of the locking portion 57. A handle 58 is bent inwardly from a junction of the locking portion 57 and the pivot arm 51.

A screw 60 comprises a screw cap 61, a screw bolt 62 and a screw thread 63. The screw bolt 62 is engaged into the pivot hole 53. The length of the screw bolt 62 is larger than the thickness of the pivot arm 51 so that the pivot arm 51 can rotate freely.

Figure 3:
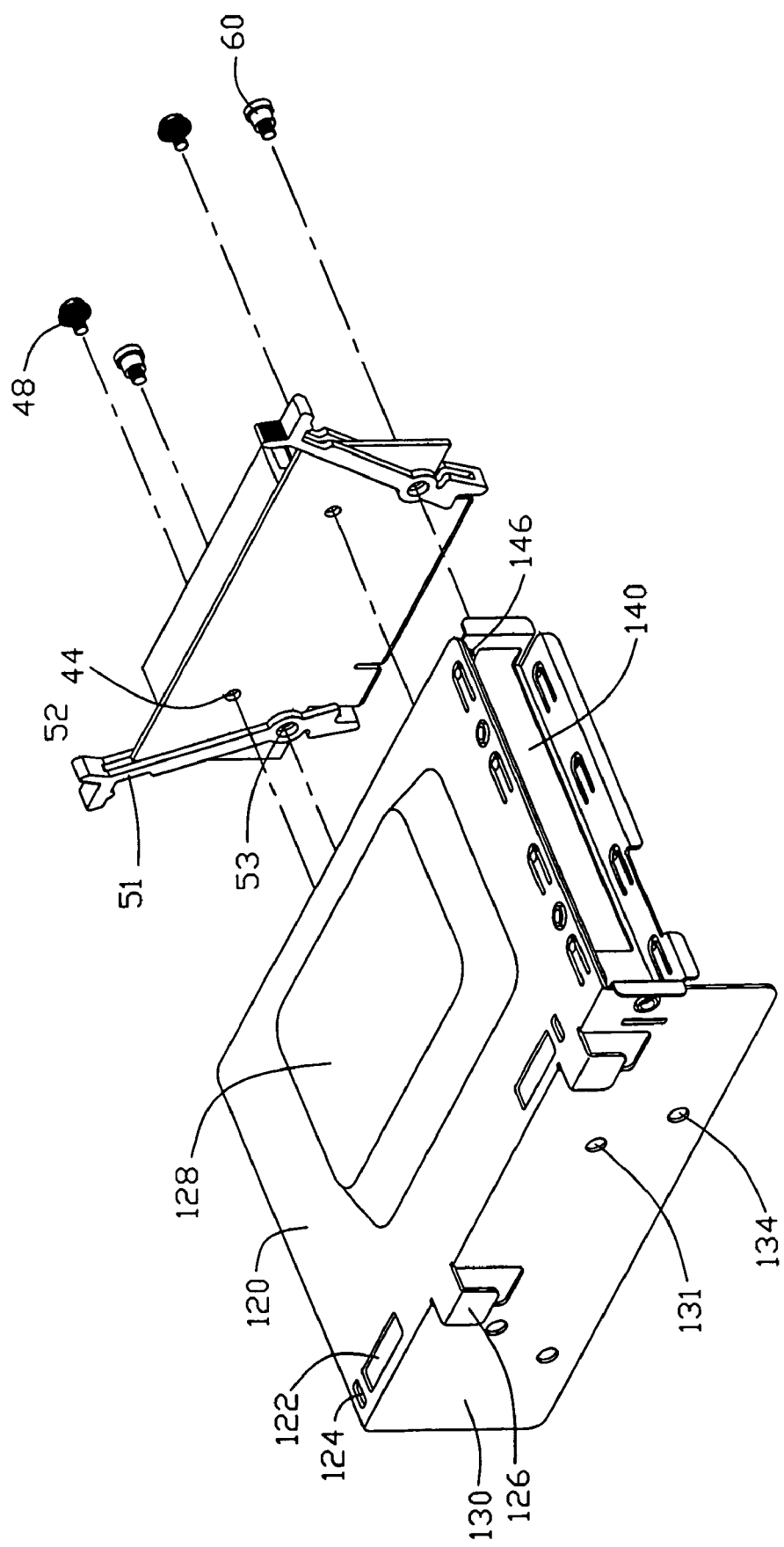
FIG. 3 shows the riser card, the ejectors attached thereon and the bracket of FIG. 1 from another aspect.
Figure 4:
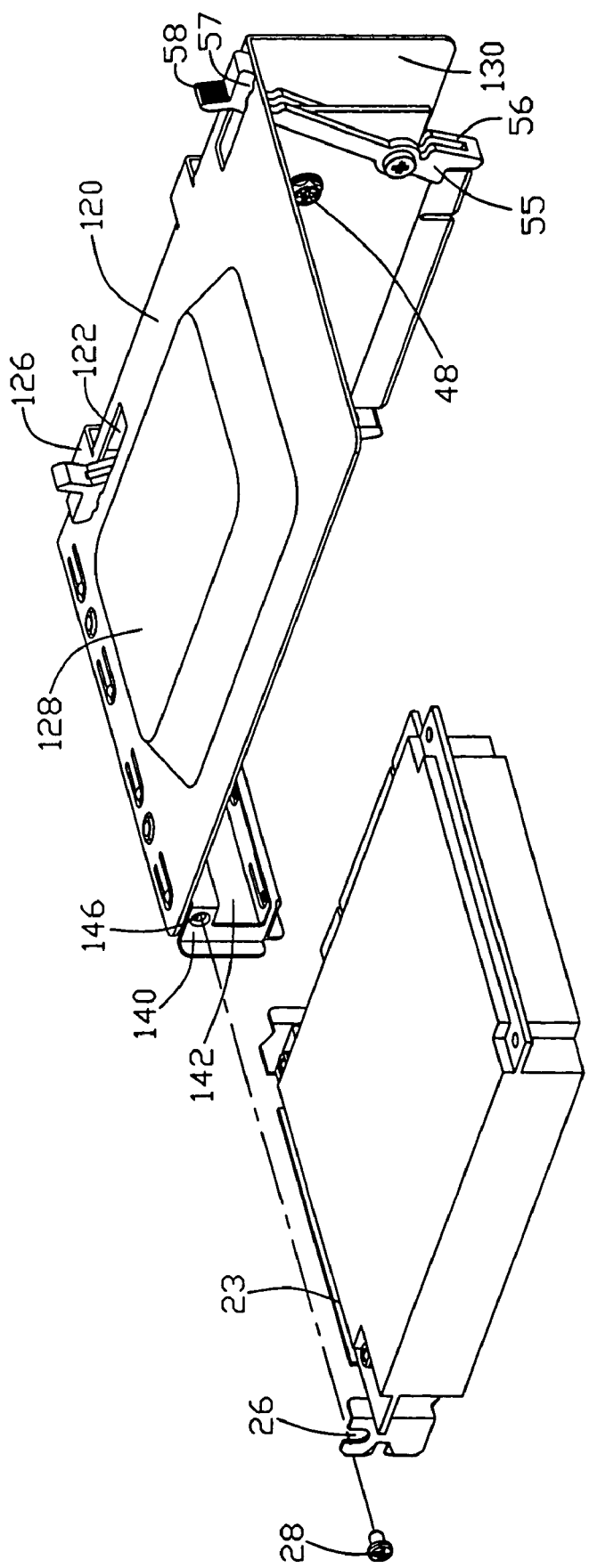
FIG. 4 is an assembled view of the riser card, the ejectors and the bracket with the expansion card in an unlocked position.

Referring also to FIGS. 3 and 4, the bracket 100 comprises a top plate 120, a side plate 130 and a rear plate 140. A pair of restraining holes 122 is defined in the top plate 120 over positions of the through holes 46 of the riser card 40 respectively. The restraining holes 122 can be extended through by the ejectors 50 and provide them with a range of rotating. A locking hole 124 is defined beside each of the restraining holes 122. A plurality of clasps 126 extends backwardly from an edge of the top plate 120 corresponding to the slits 314 of the chassis 300 respectively. A platform 128 is embossed from the middle of the top plate 120 for supporting a cover (not shown) when assembly finished. A pair of screw holes 131 is defined in the side plate 130 corresponding to the fixing holes 44 of the riser card 40 respectively. A pair of screw holes 134 is defined in the side plate 130 corresponding to the through holes 46 of the riser card 40 respectively. An expansion groove 142 is defined in one side of the rear plate 140 corresponding to the expansion card 20. A screw hole 146 is defined in one end of the rear plate 140 corresponding to the fixing hole 26 of the expansion card 20.

The two sides of the riser card 40 are embedded in the through grooves 52 of the ejectors 50 respectively. A pair of screws 60 is used to rotatably mount the ejectors 50 on the riser card 40. The screw bolts 62 of the screws 60 pass through the pivot holes 52 of the ejectors 50 and the through holes 46 of the riser card 40. Thus the ejectors 50 can pivot upon the screw bolts 62. The riser card 40 is located at the inner side of the side plate 130 of the bracket 100. The locking portion 57 and the handle 58 of the ejector 50 protrude from the restraining hole 122 of the bracket 100. Then the riser card 40 is secured to the side plate 130 of the bracket 100 via a pair of screws 48. The screw thread 63 of the screw 60 is ulteriorly screwed into the screw hole 134 of the bracket 100, thus the ejector 50 is pivotally attached to the riser card 40 and secured to the bracket 100.

Figure 5:
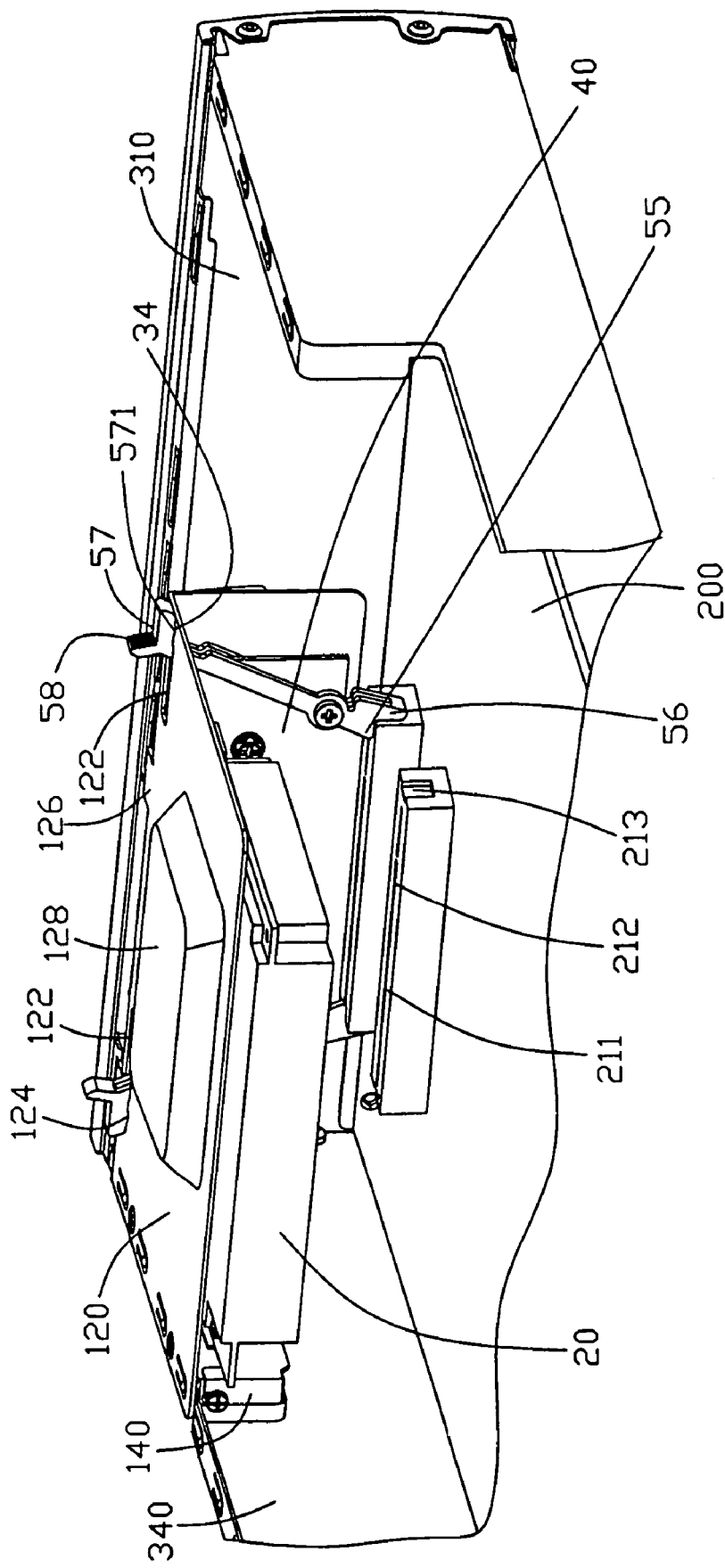
FIG. 5 is an assembled view of FIG. 1, showing the retaining device in a locked position.

Referring also to FIG. 5, in assembly, firstly, the ejectors 50 are rotatably attached to two sides of the rise card 40 respectively, and the riser card 40 is mounted on the bracket 100. The expansion card 20 is inserted into the expansion connector 42 of the riser card 40, and locked in the expansion groove 142 of the bracket 100 via a screw 28. Then the bracket 100 with the expansion card 20 and the riser card 40 mounted thereon is assembled into the chassis 300. The riser card 40 is preliminarily inserted in the connector 210 of the motherboard 200. The clasps 126 of the bracket 100 are in alignment with the slits 314 of the chassis 300, and the rear wall 140 of the bracket 100 is positioned above the opening 342 of the chassis 300. When the riser card 40 is ulteriorly inserted into the expansion slot 212 of the connector 210, the clasps 126 are engaged in the slits 314, and the rear wall 140 of the bracket 100 is accommodated in the opening 342. At the time, the pressing portion 55 of the ejector 50 presses against the top wall 211 of the connector 210. Thus the pivot arm 51 of the ejector 50 is rotated downwardly. The stopping portion 56 of the ejector 50 is accommodated in the cutout 213 of the connector 210, and the protrusion 571 is engaged in the locking hole 124 of the bracket 100, to prevent the ejector 50 from being rotated upwardly by accident. Thus the riser card 40 is secured and electrically coupled to the connector 210. Then, the chassis 300 is covered so that the platform 128 is restrained via a cover (not shown). Thus the expansion card 20 is secured in the chassis 300 via the retaining device 10.

Figure 6:
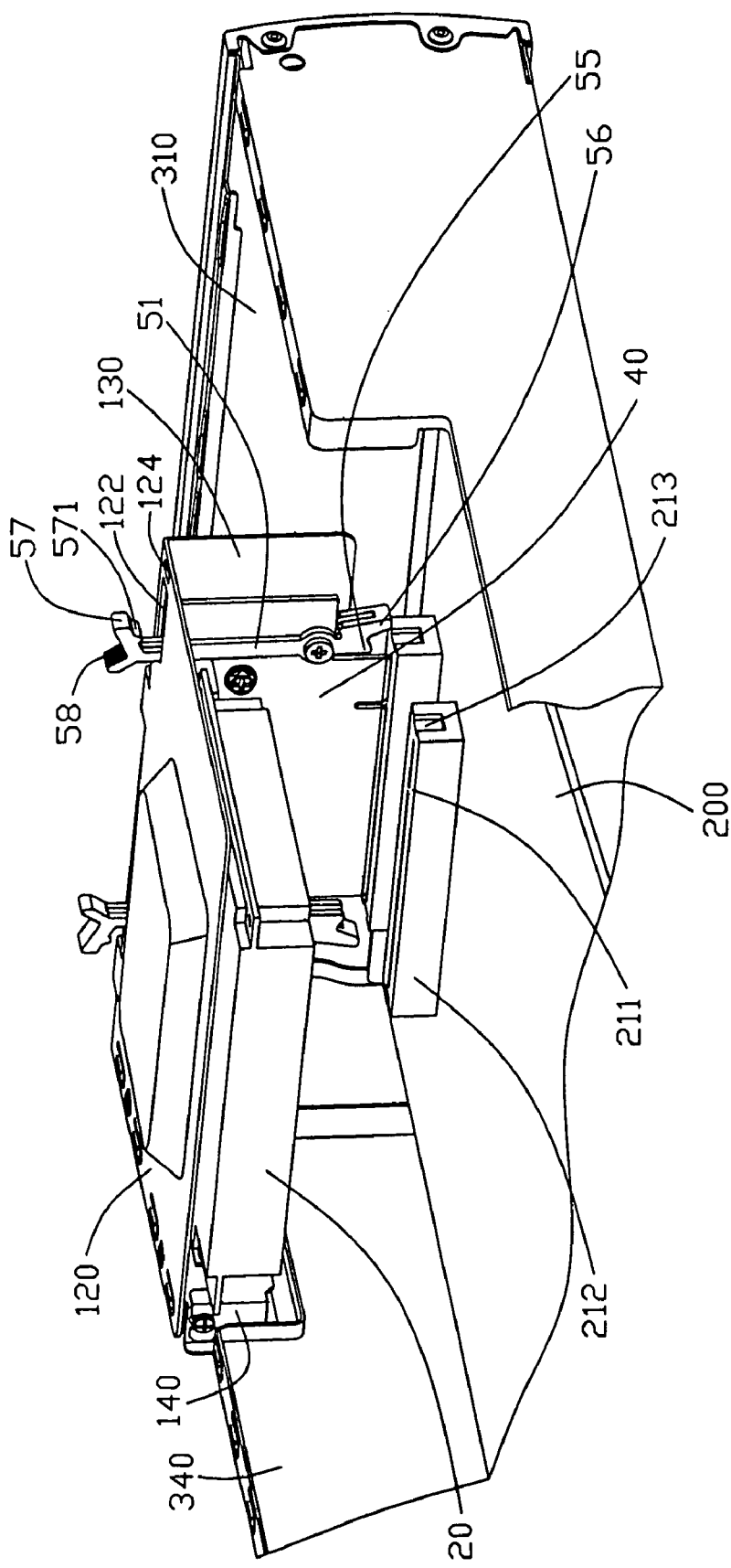
FIG. 6 is similar to FIG. 5, but showing the retain device in an unlocked position.

Referring to FIG. 6, in disassembly, the handles 58 of the ejectors 50 are pulled inwardly. The ejectors 50 are rotated upwardly around the screws 60 respectively. The pressing portion 55 of the ejector 50 moves downwardly and presses against the top wall 211 of the connector 210. The riser card 40 is lifted and disengaged from the expansion slot 212, and the clasps 126 of the bracket 100 are also disengaged from the corresponding slips 314 of the chassis 300. Thus the retaining device 10 with the expansion card 20 mounted thereon can be easily taken away from the chassis 300.

Although only one expansion card 20 is included in the above description, the retaining device 10 of the present invention is equally capable of mounting a plurality of expansion cards.

It is understood that the invention may be embodied in other forms without departing from the spirit thereof. Thus, the present examples and embodiments are to be considered in all respects as illustrative and not restrictive, and the invention is not to be limited to the details given herein.

What is claimed is:

1. A retaining device for securing a circuit board, the retaining device comprising:

a connector, the connector comprising a top wall;

a bracket comprising a top plate and a side plate, a pair of restraining holes defined in the top plate, and a locking hole defined beside each of the restraining holes, the circuit board secured to the side plate of the bracket; and a pair of ejectors pivotally attached to two sides of the circuit board, each of the ejectors comprising a pivot arm, a pressing portion formed on one end of the pivot arm, and a locking portion formed on the other end of the pivot arm;

wherein the ejectors extend through the corresponding restraining holes, when the circuit board is inserted into the connector, the ejectors are rotated with the pressing portions pressing against the top wall of the connector, and the locking portions engage in the locking holes of the bracket.

2. The retaining device as claimed in claim 1, wherein a through groove is defined in each of the ejectors for receiving the circuit board.

3. The retaining device as claimed in claim 1, wherein a screw extends through each of the ejectors, the circuit board and the side plate of the bracket, and servers as a pivot of the ejector.

4. The retaining device as claimed in claim 1, wherein a stopping portion is formed outwardly from the pressing portion, a cutout is defined in each end of the connector for receiving the stopping portion.

5. The retaining device as claimed in claim 1, wherein a protrusion is formed on the locking portion of each of the ejectors corresponding to the locking hole of the bracket.

6. The retaining device as claimed in claim 5, wherein a handle extends from a junction of the locking portion and the pivot arm.

7. The retaining device as claimed in claim 1, wherein the circuit board is a riser card which comprises an expansion connector, and an expansion card is connected to the expansion connector.

8. The retaining device as claimed in claim 7, wherein a fastening piece is attached to one side of the expansion card for being attached to a rear plate of the bracket.

9. A retaining device for securing a circuit board, the retaining device comprising:
   a motherboard, the motherboard comprising a connector, the connector comprising a top wall and two side walls extending toward the motherboard from opposite ends of the top wall; and
   a pair of ejectors pivotally attached to two sides of the circuit board, each of the ejectors comprising a pivot arm, a pressing portion formed on one end thereof, a stopping portion extending outwardly from the pressing portion, and a handle formed on the other end of the pivot arm;
   wherein when the circuit board is inserted into the connector, the stopping portions engage with outer surfaces of the side walls of the connector; when the handles are rotated toward each other, the pressing portions move downwardly toward the connector and press against the top wall of the connector to lift the circuit board.

10. The retaining device as claimed in claim 9, wherein a through groove is defined in each of the ejectors for receiving the circuit board.

11. The retaining device as claimed in claim 9, further comprising a bracket, the bracket comprising a top plate and a side plate, a pair of restraining holes for being extended through by the ejectors is defined in the top plate, and the circuit board is secured to the side plate of the bracket.

12. The retaining device as claimed in claim 11, wherein a screw extends through each of the ejectors, the circuit board and the side plate of the bracket, and servers as a pivot of the ejector.

13. The retaining device as claimed in claim 11, wherein a locking portion is formed from one end of the handle of each of the ejectors, a protrusion projects from the locking portion, and a locking hole is defined in the top plate of the bracket corresponding to the protrusion.

14. The retaining device as claimed in claim 9, wherein a cutout is defined in each of the side walls of the connector for receiving the stopping portion of each of the ejectors.

15. The retaining device as claimed in claim 11, wherein the circuit board is a riser card which comprises an expansion connector, and an expansion card is connected to the expansion connector.

16. The retaining device as claimed in claim 15, wherein a fastening piece is attached to one side of the expansion card for being attached to a rear plate of the bracket.

17. The retaining device as claimed in claim 16, wherein the motherboard is attached to a chassis, and the chassis comprises an opening defined therein for accommodating the rear plate of the bracket.

18. A retaining device for mounting a circuit board to an electronic system, comprising:
   a system connector disposed in said electronic system and electrically connectable with said circuit board;
   at least one ejector pivotally attachable to said circuit board, a pressing portion formed at one end thereof and extending reachably to said connector, and a handle formed at another end thereof and extending away from said circuit board and said connector to a user-accessible location, said at least one ejector being drivable via said handle to disconnect said system connector and said circuit board by means of engagement of said pressing portion and said system connector; and
   a bracket substantially surrounding said circuit board, and said at least one ejector securely fixable to said bracket together with said circuit.

19. The retaining device as claimed in claim 18, wherein said user-accessible location of said handle is located at a side of said bracket opposing to said circuit board surrounded by said bracket.

* * * * *